(12) United States Patent
Chang

(10) Patent No.: US 6,545,506 B1
(45) Date of Patent: Apr. 8, 2003

(54) CMOS OUTPUT DRIVER THAT CAN TOLERANT A HIGH INPUT VOLTAGE

(75) Inventor: Jiashann Chang, Cupertino, CA (US)

(73) Assignee: Silable, Inc., Los Gatos, CA (US)

( * ) Notice: Subject to any disclaimer, the term of this patent is extended or adjusted under 35 U.S.C. 154(b) by 0 days.

(21) Appl. No.: 09/524,418

(22) Filed: Mar. 11, 2000

Related U.S. Application Data

(60) Provisional application No. 60/124,104, filed on Mar. 12, 1999.

(51) Int. Cl.[7] .......................................... H03K 19/0175
(52) U.S. Cl. ............... 326/83; 326/68; 326/81
(58) Field of Search .................. 326/83, 81, 68, 326/112, 119, 121

(56) References Cited

U.S. PATENT DOCUMENTS

| | | | | |
|---|---|---|---|---|
| 5,396,128 A | * | 3/1995 | Dunning et al. | 326/68 |
| 5,748,011 A | * | 5/1998 | Takahashi | 326/83 |
| 6,028,450 A | * | 2/2000 | Nance | 326/81 |
| 6,084,431 A | * | 7/2000 | Shigehara et al. | 326/81 |

* cited by examiner

*Primary Examiner*—Michael Tokar
*Assistant Examiner*—Anh Q. Tran

(57) ABSTRACT

A CMOS output driver circuit is disclosed which can tolerant an input voltage higher than power supply voltage of the CMOS output driver circuit without drawing excessive current through the output pull-up PMOS transistor.

12 Claims, 1 Drawing Sheet

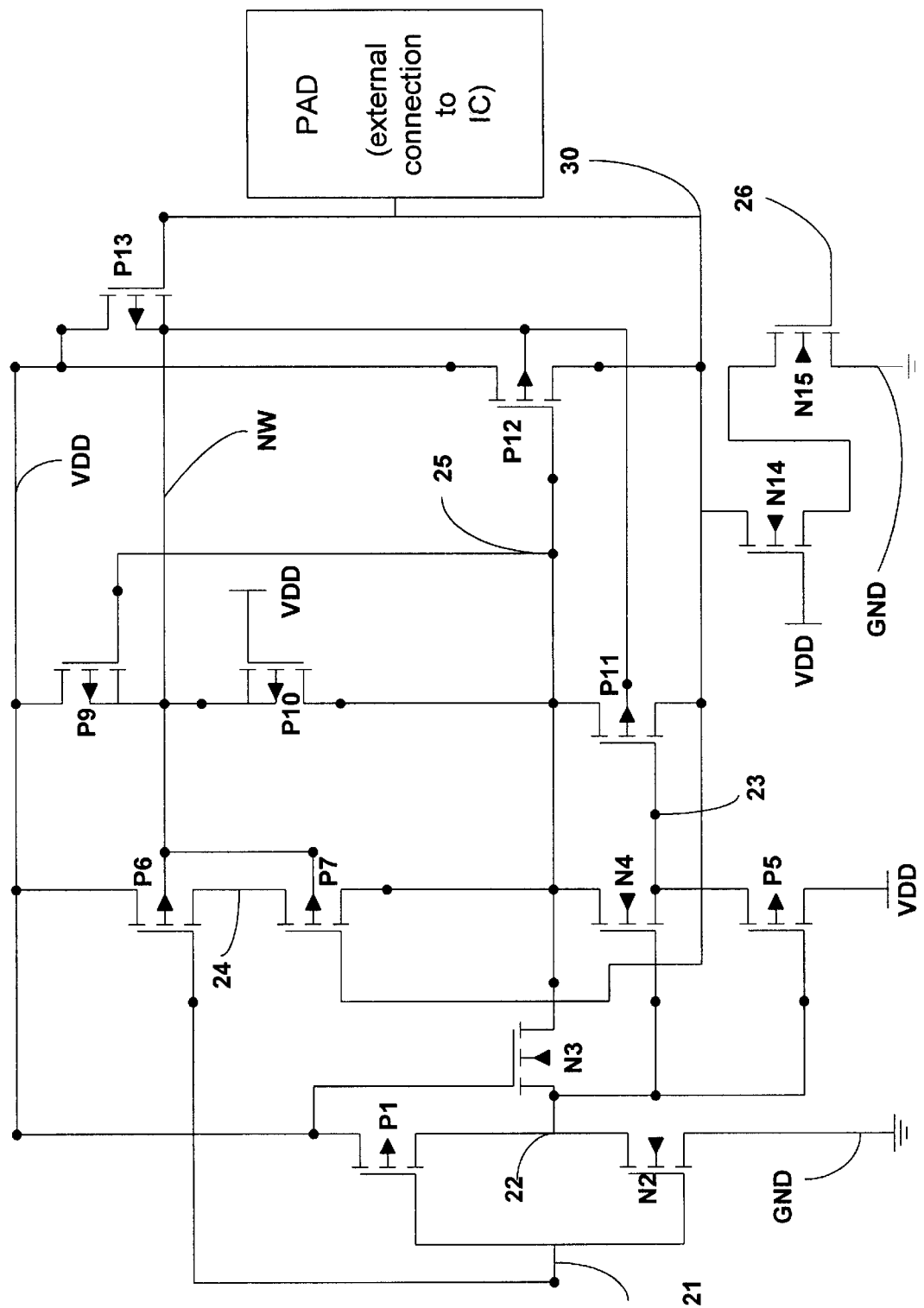

CM OS OUTPUT DRIVER THAT CAN TOLERANT A HIGH INPUT VOLTAGE

CROSS REFERENCE TO RELATED APPLICATIONS

This application claims the benefit of provisional application No. 60/124,104, filed Mar. 12, 1999.

BACKGROUND OF THE INVENTION

This invention relates to a method of design for a CMOS output circuit (which is also called a tristate, off-chip buffer circuit) which is used in an integrated circuit (IC). In this invention when the output circuit is in its tristate mode, the external terminal connection that is inside the output circuit can tolerate a voltage level exceeding the power supply voltage of the output circuit without significant leakage current flowing through the external terminal connection.

As the transistor feature sizes of the modern Complementary Metal Oxide Semiconductors (CMOS) technology has reduced progressively by physical scaling, the supply voltages of the integrated circuits has been reduced in order to reduce the voltage stress across the gate oxide. The gate oxide voltage is a key factor in determining the long term degradation of the transistor gate oxide. Furthermore, the lower power supply voltage of an integrated circuit reduces the power dissipation which allows designers to integrate more functional blocks into a single chip. Furthermore, it has become common to combine several integrated circuits within a system using different supply voltages (for an example, supply voltages can be 1.8 volts; 2.5 volts; 3.3 volts; 5 volts) all of which share the same communication bus inside a system. To perform the proper interface between chips operated on different power supply voltages requires special circuits or devices to avoid excessive leakage current and voltage stress to the input and output circuits. The addition of special devices which can tolerant higher voltage gate stress into input and output circuits of integrated circuit can increase the reliability of said circuits, but will increase the manufacture cost as well. Where possible, it is desirable to find circuit solutions to the problems created by input and output circuits operating in a multiple-power-supply system environment.

An examination of the U.S. Pat. No. 5,151,619, J. S. Austin, R. A. Piro, and D. W. Stout disclose a CMOS off-chip driver circuit having one PMOS transistor to bias the well potential of the output pull-up PMOS transistor, another two PMOS transistors and one NMOS transistor to bias the gate of output pull-up PMOS transistor to avoid any leakage when the input voltage exceeds the power supply voltage. However, this invention does allow leakage current to flow through the output pull-up PMOS transistor when the pad voltage is driven above the positive power supply voltage of output driver immediately after the off-chip driver switches from pad voltage driven-high mode to tristate mode. There is a direct current flow through the output pull-up PMOS transistor from the pad terminal to the power supply during the period when the pad terminal voltage rises from VDD to VDD+Vthp since the gate voltage of the output pull-up PMOS transistor is around VDD−Vthn, and the output pull-up PMOS transistor is conducting.

In U.S. Pat. Nos. 5,160 and 5,451,889 the output driver circuit does show similar leakage when the pad voltage rises from VDD to VDD+Vth under the same conditions. In U.S. Pat. No. 5,723,992 the author disclose a low-leakage output driver circuit, which can substantially reduce the leakage through the output pull-up PMOS transistor. However, this circuit requires an additional, high power supply to bias the well potential of the output pull-up PMOS transistor.

BRIEF DESCRIPTION OF THE VIEWS OF THE DRAWING

The FIGURE is a circuit diagram of a CMOS tristate, off-chip buffer which the invention is applied.

BRIEF SUMMARY OF THE INVENTION

This invention relates to a method of design for a CMOS output circuit (which is also called a tristate, off-chip buffer circuit) which is used in an integrated circuit (IC). When the output circuit is in its tristate mode, the off-chip pad inside the output circuit which can tolerate a voltage level exceeding the power supply voltage of the output circuit without significant leakage current. The tristate, off-chip buffer circuit may be configured for use as an output only port from the integrated circuit or as a bi-directional port in which case the tristate mode of operation is associated with the input mode.

DETAILED DESCRIPTION OF THE INVENTION

The sole FIGURE illustrates a circuit diagram of a CMOS tristate, off-chip buffer in which this invention is applied. The logic function of this tristate buffer is as follow:

| Input signal 21 | Input signal 26 | State of pad node 30 |
| --- | --- | --- |
| 0 | 0 | Tristate (high impedance) |
| 1 | 0 | 1 |
| 0 | 1 | 0 |
| 1 | 1 | Undetermined state |

Voltage level of logic "0" is defined as low or near ground level, voltage level of logic "1" is defined as near VDD. VDD is a positive power supply voltage appliked to the tristate, off-chip buffer circuit.

For the conditions of input voltage of node 21 and node 26 are near zero volts, both output driving transistors P12 and N15 are non-conducting and output pad 30 is in tristate mode which is also called the high impedance state or the input state. The impedance of pad node 30 to ground and to VDD in The sole figure, is very high because a change in the pad voltage from external sources neither sources nor sinks any appreciable current through devices P12 and N15 for the external source voltages between VDD and ground. In the tristate mode an external source may be applied to node 30, pad in The sole figure, at a voltage level which exceeds VDD. As an example, VDD equals 3.3 volts and the external source voltage equals 5 volts. In this situation, when the external source voltage level is higher than VDD, no appreciable DC current (also called DC leakage or tristate leakage) should be allowed to flow from node 30 to either VDD or the ground terminals of the IC.

The operation of tristate, off-chip buffer circuit shown in the sole figure is described in what follows. Complementary Metal Oxide Silicon with P-type substrate, N-type well technology is used in the circuit diagram shown in the sole figure. Vthp is defined as threshold voltage of PMOS transistor and Vthn is defined as threshold voltage of NMOS transistor.

(1). Pad Voltage Driven Low Mode, Node 30 is Driven to Near Zero Volts by the Buffer Vnode 21 and Vnode 26 are the signals delivered to the buffer from the IC's internal circuitry. As Vnode21 is set to near 0 volts and Vnode26 is set to near the VDD level, the internal nodes of the buffer become Vnode22=Vnode24= VDD and Vnode23=VDD−Vthn. The voltage level of node 25 is VDD minus Vthn which makes output pull-up transistor P12 non-conducting as Vnode22 rises to VDD from zero volts. Vnode26 turns on the pull-down transistor N15 which makes N15 conducting and it discharges the pad node 30 to near zero volts. As the voltage of pad node 30 drops below VDD−Vthp, transistor P7 conducts to charge node 25 to the VDD level. At nearly the same time, transistor P13 conducts to charge Vnw, the voltage of the N-well of the PMOS transistors P6, P7, P9, P10, P11, P12 and P13, to the VDD level.

(2). Pad Voltage Driven High Mode, Node 30 is Driven to Near VDD by the Buffer

As Vnode21 is set to near VDD and Vnode26 is set to be near zero volts, the internal nodes of buffer Vnode22= Vnode25 =0 volts. The voltage at node 25 falls, which in turn makes pull-up transistor P12 conducting, and charges pad node 30 up to near the VDD level. The voltage level of node 26 is near zero volts which keeps pull-down transistor N15 from conducting appreciable current. Transistor P9 conducts by means of the control voltage Vnode25 to charge Vnw, the voltage at node NW, which connects the PMOS transistor wells to VDD. The transistor P5 is conducting to charge node 23 to near the VDD level.

(3). Tristate Mode, Node 30 is Driven to the VDD Level Via an External Source

The two input signals delivered from the internal IC circuitry, Vnode21 and Vnode26 are set to be zero volts and pad node 30 is driven to VDD level from an external source. Transistor P1 conducts and charges node 22 to near the VDD level. Transistor P6 conducts and charges node 24 to near the VDD level. Vnode25 is set to be at the VDD−Vthn level by conduction of transistor N3 that in turn reduces the conduction of pull-up transistor P12 as Vnode22 rises to VDD. The pull-down transistor N15 is non-conducting because the gate voltage Vnode26 is near zero. Vnw; the voltage of N-well of the PMOS transistors is kept at the VDD level by transistor P9. When Vnode22 rises from zero to VDD, the voltage of node 23 falls down to VDD−Vthn from the VDD level.

(4). Tristate Mode, Node 30 Rises from VDD to VDD+Vthp Via an External Source

The two input signals Vnode21 and Vnode26 are set to be near zero volts and pad node 30 is driven to VDD+Vthp level from an external source. Transistor P1 conducts and charges node 22 to near the VDD level. Transistor P6 conducts and charges node 24 to near the VDD level. All transistor N3, N4 and P7 are non-conducting. Vnode25 rises from VDD−Vthn to VDD+Vthp since transistor P11 is conducting to charge node25 to the same voltage potential as pad node 30. Both the pull-down transistor N15 and pull-up transistor P12 are non-conducting. Vnw, the voltage of the PMOS transistor wells, is kept between VDD and VDD+ Vthp by a balance of conduction between transistor P10 and the PN diode between node 30 to N-well of transistor P12. When node 22 rises from zero to VDD, Vnode23 falls to VDD−Vthn from near the VDD level.

(5). Tristate Mode, Node 30 Rises Above VDD+Vthp Via an External Source

The two input signals Vnode21 and Vnode26 are set to be near zero volts and pad node 30 is driven above the VDD+Vthp level from an external source. Transistor P1 conducts and charges node 22 to near the VDD level and transistor P6 conducts and charges node 24 to near the VDD level. All transistor N3, N4 and P7 are non-conducting. Since transistor P11 is conducting, Vnode25 tracks Vnode30. Both the output pull-down transistor N15 and output pull-up transistor P12 are non-conducting. Vnw, voltage of N-well of the PMOS transistors, also tracks Vnode 30 through conduction of transistor P11 and P10. When Vnode22 rises from zero to VDD, Vnode23 falls to VDD−Vthn from near the VDD level.

As described above, there are no DC leakage paths through the CMOS tristate buffer in all 5 situations. Meanwhile, all the voltage level of Vgs (gate to source), Vgd (gate to drain) of all the transistors shown in The sole figure are equal or below VDD in all 5 situations, which avoids potential transistor reliability failure from high gate-oxide-voltage stress.

What is claimed is:

1. A CMOS output circuit comprising:
   a. a pad terminal;
   b. a pull-up transistor having a source-to-drain path and a gate, the source-to-drain path of the pull up transistor at a first end to a power supply terminal and connected at a second end to a pad terminal;
   c. a pull-down transistor having a source-to-drain path and a gate, the source-to-drain path of pull-down transistor connected at a first end to a ground terminal, the gate of the pull-down transistor connected to a pull-down control signal;
   d. a pass transistor having a source-to-drain path and a gate, the source-to-drain path of pass transistor connected in series between the second end of the pull-up transistor and the second end of the pull-down transistor, the gate of the pass transistor connected to the power supply terminal;
   e. a floating well bias circuit comprising
      i. first, second, and third transistors each having a source-to-drain path and a gate, the source-to-drain paths of the first and second transistors being each connected at a first end to the power supply terminal, a second end of the source-to-drain paths of the first and second transistors, a first end of the source-to-drain path of the third transistor, and the wells of the first, and second, and third transistors each being connected to a floating well bias circuit output node coupled to the well of the pull-up transistor;
      ii. the gate of third transistor connected to the power supply terminal, and the gate of second transistor connected to the pad terminal; and
      iii. a second end of the source-to-drain path of the third transistor connected to the gate of the first transistor and the gate of pull-up transistor;
   f. a data-input inverter circuit comprising
      i. fourth transistor having a source-to-drain path and a gate, the source-to-drain path of the fourth transistor at a first end connected to a power supply terminal and connected at a second end to a data inverter output node;
      ii. fifth transistor having a source-to-drain path and a gate, the source-to-drain path of fifth transistor connected at a first end to ground terminal and connected at a second end to a data inverter output node; and
      iii. the gates of the fourth and fifth transistors being each connected to a positive data control signal; and
   g. a pull-up gate control circuit comprising
      i. sixth and seventh transistors each having a source-to-drain path and a gate, the source-to-drain paths of the sixth and seventh transistors being each connected at a first end to the power supply terminal, the gate of the sixth transistor connected to the positive data control signal;

ii. eighth, ninth, tenth, and eleventh transistors each having a source-to-drain path and a gate, the source-to-drain paths of the eighth, ninth, tenth, and eleventh transistors being each connected at a first end to a pull-up gate control circuit output node, the gate of the eleventh transistor connected to the power supply terminal;

iii. the source-to-drain path of the eighth transistor connected at a second end to the second end of the source-to-drain path of the sixth transistor; the source-to-drain paths of the seventh and tenth transistors being each connected at a second end to the gate of the ninth transistor, the gates of the seventh and tenth transistors being each connected to the data inverter output node coupled to the source-to-drain path of the eleventh transistor at a second end;

iv. the source-to-drain path of the ninth transistor connected at a second end to the pad terminal coupled to the gate of the eighth transistor, the gate of the pull-up transistor connected to the pull-up gate control circuit output node; and v. the wells of sixth and eighth transistors each connected to the floating well bias circuit output node coupled to the well of the ninth transistor.

2. The CMOS output circuit of claim 1 wherein the pull-down transistor, the pass transistor, the fifth transistor, the tenth transistor and the eleventh transistor are NMOS transistors and the other transistors are PMOS transistors.

3. A CMOS output circuit according to claim 2 comprising:

a. a pull-up transistor having a well, and a gate and a source-to-drain path connected at a first end to a power supply potential and connected to a pad terminal at a second end; said gate connected to a pull-up control potential through a pull-up gate control circuit, said well of said pull-up transistor connected to said power supply potential, said pad terminal and said gate of pull-up transistor through a floating well bias circuit;

b. a pull-down transistor having a gate and a source-to-drain path at a first end connected to a ground potential and connected to first internal node at a second end; said gate connected to a pull-down control potential;

c. a pass transistor having a gate and a source-to-drain path at a first end connected to the pad terminal and connected to said first internal node at a second end; said gate connected to the power supply potential;

d. a pull-up gate control circuit connected to the pad terminal and the pull-up transistor means, said pull-up gate control circuit to allow the voltage on said pad terminal having a magnitude significantly greater than that of said power supply potential; and, e. a floating well bias circuit connected to the pad terminal and the pull-up transistor means, said floating well bias circuit to allow the voltage on said pad terminal having a magnitude significantly greater than that of said power supply potential.

4. A circuit according to claim 3 wherein the pull-down transistor, the pass transistor are NMOS transistors and the pull-up transistor is PMOS transistor.

5. A circuit according to claim 4 wherein the voltage on said power supply potential is a positive voltage of about 3.3 volts and the voltage on said ground potential is a reference voltage.

6. A circuit according to claim 4 wherein the voltage on said power supply potential is a positive voltage of about 2.5 volts and the voltage on said ground potential is a reference voltage.

7. A circuit according to claim 4 wherein the voltage on said power supply potential is a positive voltage of about 1.8 volts and the voltage on said ground potential is a reference voltage.

8. A circuit according to claim 4 wherein the voltage on said power supply potential is a positive voltage of about 1.5 volts and the voltage on said ground potential is a reference voltage.

9. A circuit according to claim 4 wherein the voltage on said power supply potential is a positive voltage of about 1.2 volts and the voltage on said ground potential is a reference voltage.

10. A circuit according to claim 4 wherein said floating well bias circuit includes:

a. a first transistor have a source-to-drain path connected said well of said pull-up transistor to said power supply potential and having a gate connected to said gate of pull-up transistor;

b. a second transistor have a source-to-drain path connected said well of said pull-up transistor to said power supply potential and having a gate connected to said pad terminal;

c. a third transistor have a source-to-drain path connected said well of said pull-up transistor to said gate of pull-up transistor and having a gate connected to said power supply potential;

d. each of said first, second, and third transistor having a well connected to said well of said pull-up transistor; and e. each of said first, second, and third transistor is PMOS transistor.

11. A circuit according to claim 4 wherein said pull-up gate control circuit includes:

a. a fourth transistor have a source-to-drain path connected to said power supply potential to an inverter output node and having a gate connected to said pull-up control potential;

b. a fifth transistor have a source-to-drain path connected to said ground potential to said inverter output node and having a gate connected to said pull-up control potential;

c. a sixth transistor have a source-to-drain path connected to said power supply potential to a second internal node and having a gate connected to said pull-up control potential;

d. a seventh transistor have a source-to-drain path connected to said power supply to a third internal node and having a gate connected to said inverter output node;

e. a eighth transistor have a source-to-drain path connected to said gate of pull-up transistor to said second internal node and having a gate connected to said pad terminal;

f. a ninth transistor have a source-to-drain path connected to said gate of pull-up transistor to said pad terminal and having a gate connected to said third internal node;

g. a tenth transistor have a source-to-drain path connected to said gate of pull-up transistor to said third internal node and having a gate connected to said inverter output node;

h. a eleventh transistor have a source-to-drain path connected to said gate of pull-up transistor to said inverter output node and having a gate connected to said power supply potential; and i. the wells of said sixth, eighth, and ninth transistor are connected to said well of the pull-up transistor.

12. A circuit according to claim 11 wherein the fifth, tenth, and eleventh transistor are NMOS transistors and the other transistors are PMOS transistors.

* * * * *